(12) United States Patent
Basu et al.

(10) Patent No.: US 10,931,128 B2
(45) Date of Patent: Feb. 23, 2021

(54) METHOD AND APPARATUS TO PREDICT CAPACITY FADE RATE OF BATTERY

(71) Applicant: Samsung Electronics Co., Ltd., Suwon-si (KR)

(72) Inventors: Suman Basu, Bangalore (IN); Krishnan S. Hariharan, Bangalore (IN); Tae Won Song, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 221 days.

(21) Appl. No.: 15/879,833

(22) Filed: Jan. 25, 2018

(65) Prior Publication Data
US 2018/0316204 A1   Nov. 1, 2018

(30) Foreign Application Priority Data

Apr. 28, 2017  (IN) .............................. 201741015142
Sep. 26, 2017  (KR) ........................ 10-2017-0124403

(51) Int. Cl.
| | | |
|---|---|---|
| *H02J 7/00* | (2006.01) | |
| *H01M 10/48* | (2006.01) | |
| *G01R 31/392* | (2019.01) | |
| *G01R 31/3842* | (2019.01) | |
| *G01R 31/367* | (2019.01) | |

(52) U.S. Cl.
CPC ........ *H02J 7/0047* (2013.01); *G01R 31/3842* (2019.01); *G01R 31/392* (2019.01); *H01M 10/48* (2013.01); *G01R 31/367* (2019.01); *H02J 7/0048* (2020.01)

(58) Field of Classification Search
None
See application file for complete search history.

(56) References Cited

U.S. PATENT DOCUMENTS

2014/0244225 A1* 8/2014 Balasingam ......... G01R 31/367
                                                                 703/2
2018/0041063 A1* 2/2018 Isomura .................. B60L 53/56

FOREIGN PATENT DOCUMENTS

| JP | 2008-39526 A | 2/2008 |
| JP | 4587299 B2 | 9/2010 |
| KR | 10-2010-0085791 A | 7/2010 |
| KR | 10-2013-0036712 A | 4/2013 |
| KR | 10-2015-0120697 A | 10/2015 |
| KR | 10-2016-0000317 A | 1/2016 |

OTHER PUBLICATIONS

William Scott, "Impact of high fidelity battery models for vehicle solutions," 2015, University of Waterloo, 114 pages (Year: 2015).*

(Continued)

*Primary Examiner* — Kamini S Shah
*Assistant Examiner* — Russ Guill
(74) *Attorney, Agent, or Firm* — NSIP Law

(57) ABSTRACT

A method and apparatus for predicting a capacity fade rate of a battery are provided. The method includes collecting capacity degradation data of a battery based on a current and a state of charge (SOC) for a predefined number of cycles, generating a capacity fade model based on the capacity degradation data, and estimating a capacity fade rate of the battery using the capacity fade model.

11 Claims, 9 Drawing Sheets

(56) References Cited

OTHER PUBLICATIONS

Joel C. Forman et al., "Optimal experimental design for modeling battery degradation," 2012, ASME 2012 5t h Annual Dynamic Systems and Control Conference, ten pages (Year: 2012).*

Heng Zhang et al., "A method for pre-determining the optimal remanufacturing point of lithium ion batteries," 2014, 21st CIRP Conference on Life Cycle Engineering, five pages (Year: 2014).*

Nicholas Dane Williard, "Degradation analysis and health monitoring of lithium ion batteries," 2011, University of Maryland, 110 pages (Year: 2011).*

* cited by examiner

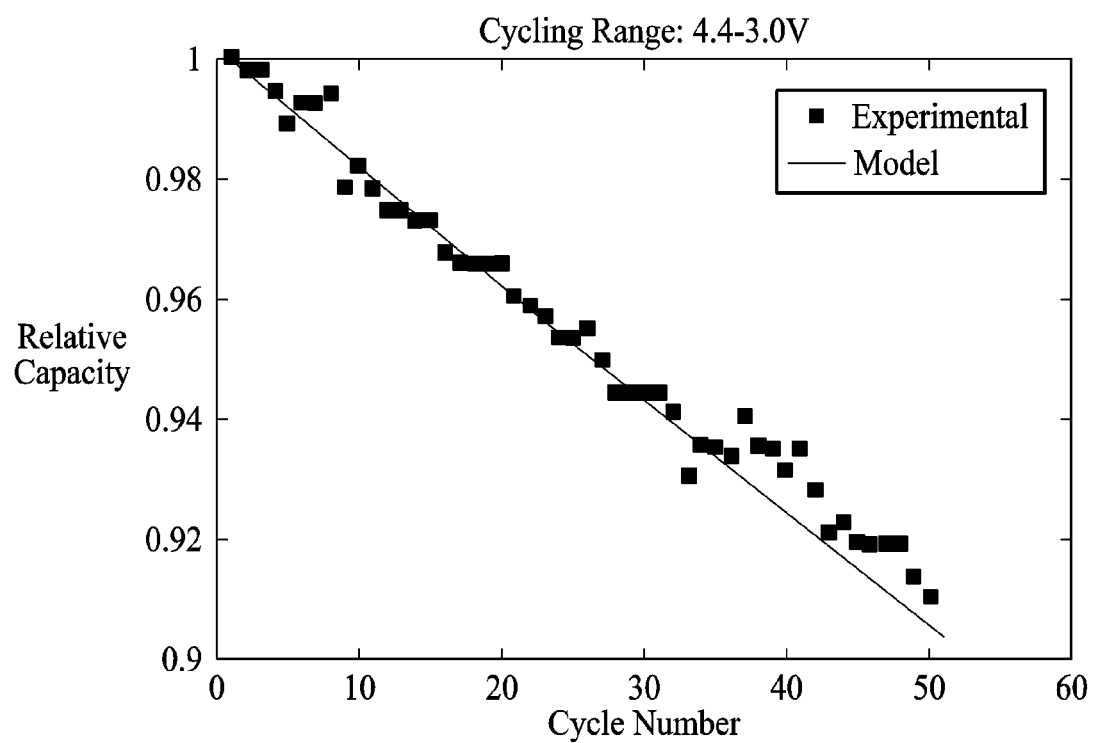

METHOD AND APPARATUS TO PREDICT CAPACITY FADE RATE OF BATTERY

CROSS-REFERENCE TO RELATED APPLICATIONS

This application claims the benefit under 35 USC 119(a) of Indian Patent Application No. 201741015142, filed on Apr. 28, 2017, in the Office of the Controller General of Patents, Designs & Trade Marks, and Korean Patent Application No. 10-2017-0124403, filed on Sep. 26, 2017, in the Korean Intellectual Property Office, the entire disclosures of which are incorporated herein by reference for all purposes.

BACKGROUND

1. Field

The following description relates to a method and apparatus to predict a capacity fade rate of a battery.

2. Description of Related Art

Due to enormous development in markets of electric vehicle (EV) and use of accumulated energy, use of rechargeable batteries with a high volumetric density of stored energy is needed, and multiple charging and discharging cycles are required. Rechargeable batteries reduce hardware costs and provide a low environmental impact. Rechargeable batteries include, for example, a lithium (Li)-ion battery that is mainly used in EVs and hybrid EVs. However, a capacity of the Li-ion battery decreases over time, which is referred to as a "charge-discharge cycling." In the Li-ion battery, a capacity loss occurs as a result of multiple factors, for example, a Li-loss, an active material loss, or an electrolyte degradation. In modern high-energy composite cathode materials for Li-ion cells, a cathode degradation is regarded to be more important than an existing anode degradation during a calculation of a capacity loss. Generally, the Li-ion battery exhibits a slow degradation over thousands of cycles. Such a slow capacity degradation usually arises from irreversible electrochemical processes that gradually compete with reversible lithium intercalation in electrodes.

Thus, there is a desire to generate a mathematical model to predict a life expectancy and a capacity fade/degradation rate of a battery. Mathematical models include, for example, a physics-based degradation model for predetermined components known in Li-ion batteries. In particular, during charging of Li-ion batteries, a fundamental source of a capacity fade in the Li-ion batteries occurs due to a loss of Li to a solid electrolyte interphase (SEI). In physics-based degradation models, a formation of the SEI on an anode is considered, and an active material loss on a cathode and an electrolyte decomposition are also considered to predict a life of a battery. However, it is difficult to implement physics-based degradation models in a battery management system (BMS) due to uncertain parameters, and due to a high computational cost needed.

One mathematical model uses data-based models using regression/machine learning techniques to predict a life of a battery. However, a data-based model requires a large amount of data that may require a large amount of time, in years, despite multiple testing stations.

In above described models, an investigation of a capacity fade rate is performed using a known or fixed charge-discharge cycle at a controlled temperature.

However, it is impossible to predict a capacity loss in an arbitrary usage pattern (for example, a user-specific usage pattern), a variable discharge rate and incomplete (or broken) cycles, for most of operating conditions.

Thus, there is a desire for a new model to predict a capacity fade rate or a state of health (SOH) of a Li-ion battery independent of temperature.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of predicting a capacity fade rate of a battery includes collecting capacity degradation data of a battery based on a current and a state of charge (SOC) for a predefined number of cycles, generating a capacity fade model based on the capacity degradation data, and estimating a capacity fade rate of the battery using the capacity fade model.

The capacity fade model may include dividing a difference in logarithm of fractional capacities after a cycling between different SOCs by a product that may include a difference between the SOCs and the number of cycles. The fractional capacities may be each defined as a ratio of a cell capacity at an end of the cycling to an initial cell capacity.

The battery may include any one or any combination of a nickel-cadmium battery, a nickel-metal hydride battery, a lithium-ion battery, a lithium sulfur battery, a thin film battery, a carbon foam-based lead acid battery, a potassium-ion battery and a sodium-ion battery.

The number of cycles may be determined based on maximum allowable degradation conditions.

The capacity degradation data may be collected based on a change in a condition. The condition may include a first condition with an equal degradation level during a charge and discharge cycle and a second condition with a different degradation level during a charge and discharge cycle at a constant charging current.

The capacity fade rate may be notified from a mobile phone of a user.

In a general aspect, a non-transitory computer-readable storage medium is described storing instructions that, when executed by a processor, cause the processor to perform the method described above.

In another general aspect, an apparatus for predicting a capacity fade rate of a battery includes a multichannel battery cycler configured to collect capacity degradation data of a battery based on a current and an SOC for a predefined number of cycles, a capacity fade modeler configured to generate a capacity fade model based on the capacity degradation data, and a controller configured to estimate a capacity fade rate of the battery using the capacity fade model.

The capacity fade model may include dividing a difference in logarithm of fractional capacities after a cycling between different SOCs by a product that may include a difference between the SOCs and the number of cycles. The fractional capacities may be each defined as a ratio of a cell capacity at an end of the cycling to an initial cell capacity.

The battery may include any one or any combination of a nickel-cadmium battery, a nickel-metal hydride battery, a lithium-ion battery, a lithium sulfur battery, a thin film battery, a carbon foam-based lead acid battery, a potassium-ion battery and a sodium-ion battery.

The number of cycles may be determined based on maximum allowable degradation conditions.

The capacity degradation data may be collected based on a change in a condition. The condition may include a first condition with an equal degradation level during a charge and discharge cycle and a second condition with a different degradation level during a charge and discharge cycle at a constant charging current.

The capacity fade rate may be notified from a mobile phone of a user.

Other features and aspects will be apparent from the following detailed description, the drawings, and the claims.

BRIEF DESCRIPTION OF THE DRAWINGS

FIGS. 4A through 4E illustrate examples of a validation result of a capacity fade rate of a rechargeable battery acquired in different voltage ranges.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
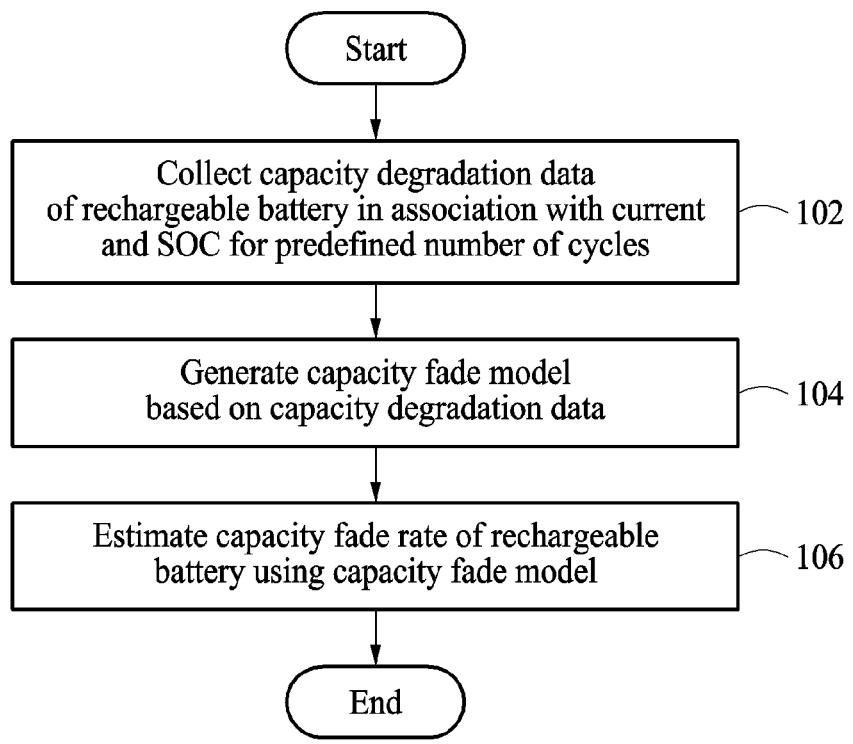
FIG. 1 is a flowchart illustrating an example of a method to predict a capacity fade rate of a battery.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood. Terms defined in dictionaries generally used should be construed to have meanings matching with contextual meanings in the related art and are not to be construed as an ideal or excessively formal meaning unless otherwise defined herein.

Hereinafter, examples will be described in detail with reference to the accompanying drawings, and like reference numerals in the drawings refer to like elements throughout.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

FIG. 1 is a flowchart illustrating an example of a method to predict a capacity fade rate of a battery.

FIG. 1 illustrates a method of predicting a capacity fade rate of a rechargeable battery, for example, a lithium (Li)-ion battery. A capacity is degraded due to various factors, for example, a growth of a solid electrolyte interphase (SEI) on an anode, a loss of an active material on a cathode, and an electrolyte decomposition. A capacity degradation is predicted as a function of a state of charge (SOC) and a current I. For example, a capacity of a cell C is defined using Equation 1 shown below.

$$\frac{dC}{dt} = -f(soc, I) \quad \text{[Equation 1]}$$

Based on Equation 1, it is inferred that a greater capacity loss occurs at a higher current and/or a greater SOC range. However, an effect of a temperature is neglected, because the effect is easily considered or accounted for through an Arrhenius equation. Thus, the capacity fade rate is predicted in terms of the SOC and the current I.

In operation 102, capacity degradation data of the rechargeable battery based on, corresponding to, or associated with the current and the SOC is collected for a predefined number of cycles under predefined conditions.

For example, the number of cycles is determined based on maximum allowable degradation conditions. Two degradation conditions are considered, for example, a first condition and a second condition. The first condition corresponds to considering equal degradation levels during a charge and discharge cycle. The second condition corresponds to considering different degradation levels during a charge and discharge cycle at a constant charging current.

A degradation of a Li-ion cell of a total capacity C is the function of the SOC and the current I, and both the SOC and the current I are independent. A capacity of a cell is provided by Equation 2 shown below.

$$\frac{dC}{dt} = -f(soc, I) = -f_1(soc) \cdot f_2(I) \quad \text{[Equation 2]}$$

Equation 3 is shown below, and accordingly Equation 4 is obtained.

$$I dt = C d(soc) \quad \text{[Equation 3]}$$

$$\frac{dC}{C} = d(\ln(C)) = -f_1(soc) \cdot \frac{f_2(I)}{I} d(soc) \quad \text{[Equation 4]}$$

By integrating Equation 4 for a constant current over a charge and discharge cycle from an n-th cycle to an (n+1)-th cycle based on the first condition, Equation 5 is obtained as shown below.

$$\ln\left(\frac{C^{n+1}}{C^n}\right) = -2f_3(I)\int_{soc^{min}}^{soc^{max}} f_1(soc)d(soc) \quad \text{[Equation 5]}$$
$$= -f_3(I)[G_1(soc^{max}) - G_1(soc^{min})]$$

In Equation 5, $G_1(soc)$ and $f_3(I)$ are represented by Equations 6 and 7 shown below.

$$G_1(soc) = 2\int f_1(soc)d(soc) \quad \text{[Equation 6]}$$

$$f_3(I) = \frac{f_2(I)}{I} \quad \text{[Equation 7]}$$

A right-hand side (RHS) of Equation 5 is constant.

The second condition is used to calculate a capacity fade rate, and accordingly the capacity fade rate is calculated using Equations 8, 9 and 10 shown below.

$$\ln\left(\frac{C^{n+1}}{C^n}\right) = \quad \text{[Equation 8]}$$
$$-f_3(I)\int_{soc^{min}}^{soc^{max}} f_1(soc)d(soc) - f_3(I)\int_{soc^{min}}^{soc^{max}} f_4(soc)d(soc)$$

$$\ln\left(\frac{C^{n+1}}{C^n}\right) = -f_3(I)\int_{soc^{min}}^{soc^{max}} (f_1(soc) + f_4(soc))d(soc) \quad \text{[Equation 9]}$$

$$\ln\left(\frac{C^{n+1}}{C^n}\right) = -f_3(I)[\tilde{G}_1(soc^{max}) - \tilde{G}_1(soc^{min})] \quad \text{[Equation 10]}$$

In Equation 10, $\tilde{G}_1(soc)$ is represented by Equation 11 shown below.

$$\tilde{G}_1(soc) = \int (f_1(soc) + f_4(soc))d(soc) \quad \text{[Equation 11]}$$

An RHS of Equation 10 is constant.
Thus, for all conditions, Equation 12 is obtained after "n" cycles.

$$\frac{1}{n}\ln\left(\frac{C^n}{C^0}\right) = -f_3(I)[G_1(soc^{max}) - G_1(soc^{min})] \quad \text{[Equation 12]}$$

A maximum voltage changes in experiments to reconstruct $f_1(soc)$.

Two different values of $soc^1$ and $soc^2$ are considered as shown in Equations 13 and 14 below. By applying Equations 13 and 14 to Equation 15, Equation 16 is obtained.

$$f_3(I)[G_1(soc^2) - G_1(soc^{max})] = \frac{1}{n}\ln\left(\frac{C^n}{C^0}\right)_{@2} \quad \text{[Equation 13]}$$

$$f_3(I)[G_1(soc^1) - G_1(soc^{max})] = \frac{1}{n}\ln\left(\frac{C^n}{C^0}\right)_{@1} \quad \text{[Equation 14]}$$

$$\frac{G_1(soc^2) - G_1(soc^1)}{(soc^2 - soc^1)} = f_1(0.5(soc^2 + soc^1)) \quad \text{[Equation 15]}$$

$$f_3(I) \cdot f_2(0.5(soc^2 + soc^1)) = \frac{\ln\left(\frac{C^n}{C^0}\right)_{@2} - \ln\left(\frac{C^n}{C^0}\right)_{@1}}{n(soc^2 - soc^1)} \quad \text{[Equation 16]}$$

Equation 16 represents a model generated based on capacity degradation data.

To collect data, capacity degradation data for "n" cycles needs to be collected based on the following two conditions: Minimum SOC (for example, a voltage) cutoff ($SOC^1$, $SOC^2$, ..., $SOC^p$); and Cycling current ($I^1$, $I^2$, ..., $I^q$).

A number "n" of cycles is determined based on maximum allowable degradation conditions. For example, when cycling of a cell is performed at a maximum allowable current $I^{max}$ in a maximum SOC range (for example, a range of 0 to 1), the cell reaches an end of a life capacity (for example, 80% of a capacity of a new cell) after "100" cycles. In this example, "n" is equal to "100."

In the present disclosure, cycling is a decrease in a capacity of a battery based on charging and discharging of the battery.

For a good estimation of a degradation function, ten values (for example, p~10) of a minimum SOC need to be used although a current range is covered by five values (for example, q~5), because an effect of a current is expected to be high at a high discharge rate. In one example, all data is collected for a period of three to four months using a 25-channel battery cycler. Based on the collected data, a capacity fade model is generated to predict a capacity fade rate. In operation 104, a capacity fade model is generated based on the capacity degradation data.

In operation 106, a capacity fade rate of the rechargeable battery is estimated using the generated capacity fade model. The generated capacity fade model is used to determine a capacity fade rate for an arbitrary usage cycle.

Figure 2:
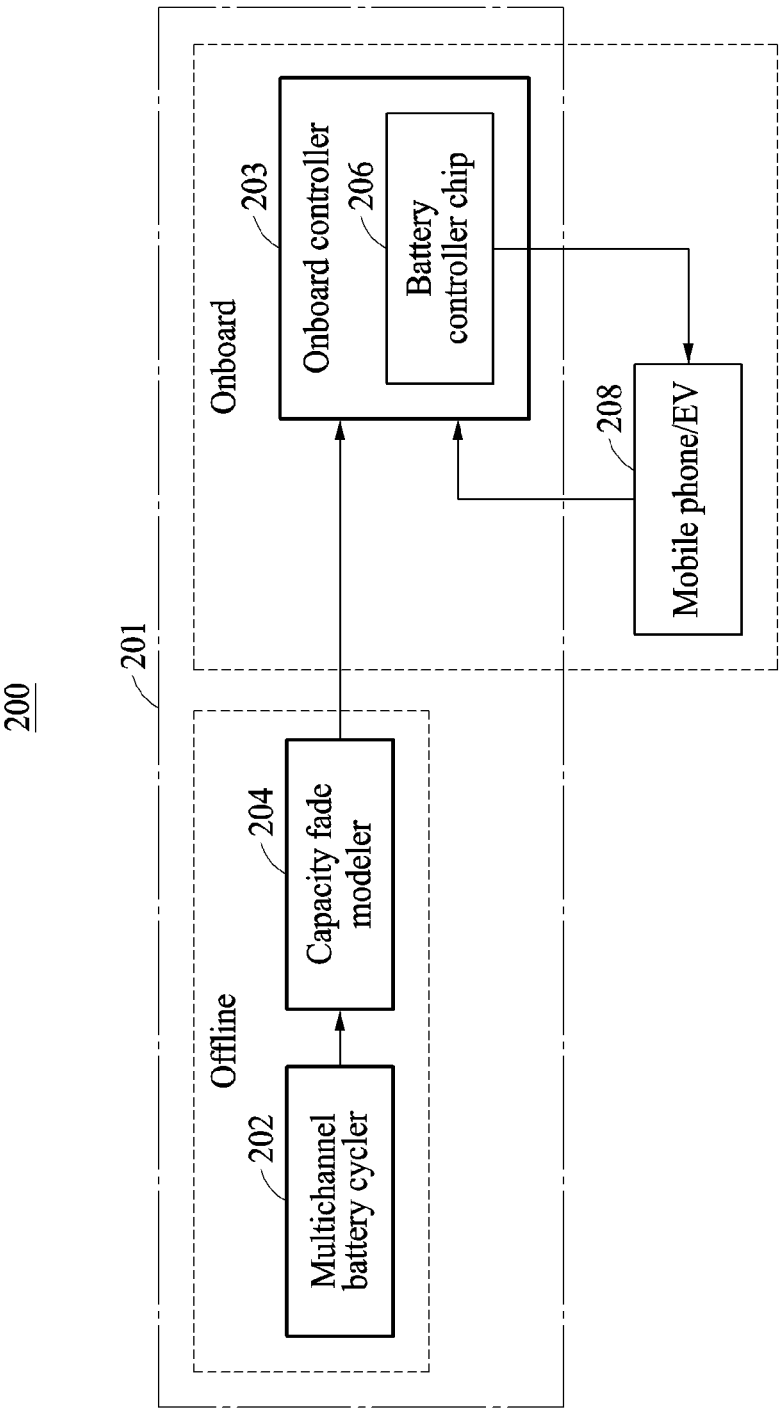
FIG. 2 is a block diagram illustrating an example of a system to predict a capacity fade rate of a battery.

FIG. 2 is a block diagram illustrating an example of a system 200 to predict a capacity fade rate of a battery.

Referring to FIG. 2, the system 200 includes an apparatus 201 configured to predict a capacity fade rate of a Li-ion battery, and an apparatus 208 that includes the Li-ion battery.

The apparatus 201 includes a multichannel battery cycler 202, a capacity degradation modeler 204, and an onboard controller 203. The apparatus 208 is, for example, a mobile phone or an EV that includes a Li-ion battery.

The onboard controller 203 includes a battery controller chip 206. Hereinafter, a function of each component of the system 200 will be described in detail.

The multichannel battery cycler 202 is configured to repeatedly perform charging and discharging of a given battery in different voltage ranges to verify whether the battery meets or exceeds a desired cycle life.

During a charge and discharge cycle, the multichannel battery cycler 202 collects capacity degradation data of the battery based on, corresponding to, or associated with an SOC and a current for a predefined number of cycles. For example, during a single cycle, a fully charged battery is completely discharged.

The Li-ion battery is placed on the multichannel battery cycler 202 to charge and discharge the Li-ion battery. For example, a battery is charged and discharged based on changes in the following two conditions: Minimum SOC (for example, a voltage) cutoff ($SOC^1$, $SOC^2$, . . . , $SOC^p$); and Cycling current ($I^1$, $I^2$, . . . , $I^q$).

Various voltage ranges are provided, for example, a range of 4.3 volts (V) to 3 V, or a range of 4.4 V to 3 V. A number "n" of cycles is determined based on maximum allowable degradation conditions. For example, when cycling of a cell is performed at a maximum allowable current $I^{max}$ in a maximum SOC range (for example, a range of 0 to 1), the cell reaches an end of a life capacity (for example, 80% of a capacity of a new cell) after "100" cycles. In this example, "n" is equal to "100."

For a good estimation of a degradation function, ten values (for example, p~10) of a minimum SOC need to be used, although a current range is covered by five values (for example, q~5), because an effect of a current is expected to be high at a high discharge rate.

Cn denotes a capacity acquired in a predetermined voltage range after a charging and discharging process for "100" cycles is completed. Because the SOC and the current are directly linked to the voltage range, the acquired capacity is fed to the capacity fade modeler 204.

The capacity fade modeler 204 calculates a capacity fade rate of the battery based on data collected by the multichannel battery cycler 202. An amount of charge supplied to the battery is considerably reduced after a number of cycles. Thus, a ratio of an amount of charge remaining in the battery after the "100" cycles to an initial amount of charge in a fresh battery is defined as a ratio of Cn to C0.

For example, a set of all the above data is collected offline for a period of three to four months using a 25-channel battery cycler, and is provided to the capacity fade modeler 204.

The capacity fade modeler 204 applies the capacity degradation data collected by the multichannel battery cycler 202 to Equation 16. The capacity fade modeler 204 generates a capacity fade model and transmits the generated capacity fade model to the onboard controller 203.

The onboard controller 203 estimates a capacity fade rate of a battery, for example, a Li-ion battery, using the capacity fade model. Also, the onboard controller 203 predicts a remaining life of the battery.

The predicted remaining life is reported to the apparatus 208. For example, an offline generated capacity fade model helps to predict a remaining life of a battery in response to an arbitrary use of a mobile phone or electric vehicle (EV) onboard. It is possible for the mobile phone (the apparatus 208) or the EV to provide feedback in response to a use of the battery, which aids the onboard controller 203 to provide accurate values.

Figure 3A:
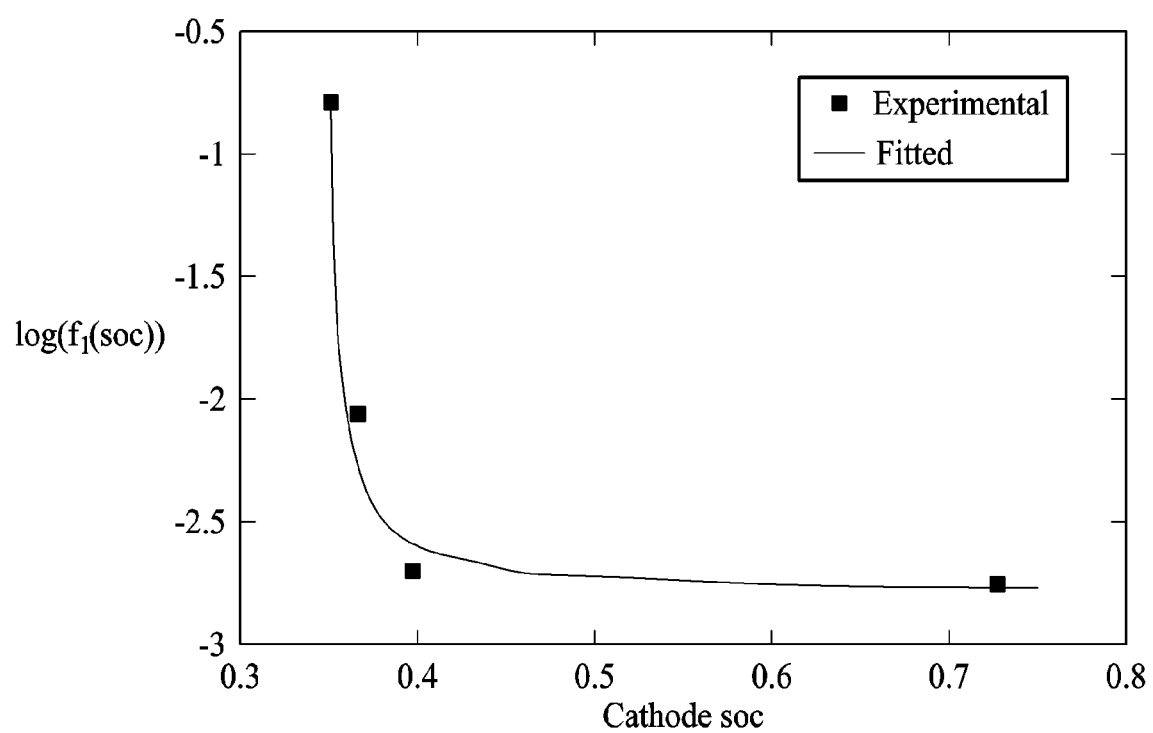
FIGS. 3A and 3B are graphical representations illustrating examples of results of capacity degradation data of a rechargeable battery acquired using a capacity fade model.
Figure 3B:
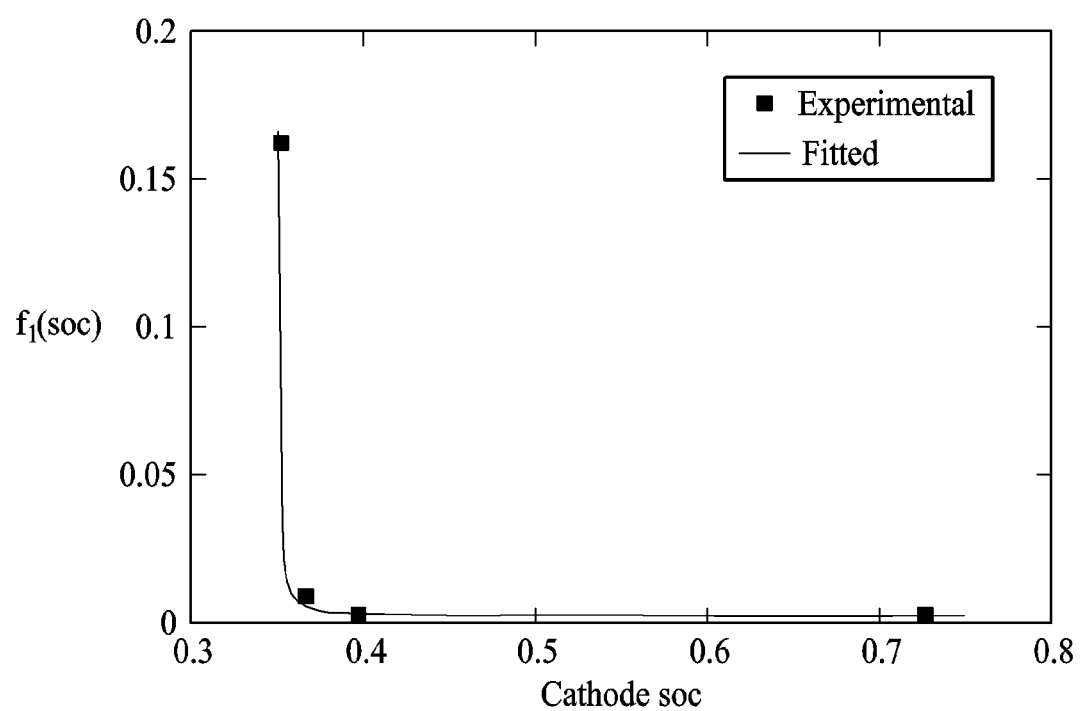

FIGS. 3A and 3B are graphical representations illustrating examples of results of capacity degradation data of a rechargeable battery acquired using a capacity fade model.

Degradation data of a Li-nickel-cobalt-manganese (NCM) cell is acquired using Equation 17 shown below.

$$\log(f_1(soc)) = \frac{0.0105}{soc - 0.346} - 2.8 \quad \text{[Equation 17]}$$

A fitting form representing a capacity fade rate as a function of an SOC obtained using the above formula is shown in FIG. 3A. Similarly, a capacity fade rate is obtained as a function of an SOC using an experimental setup or an apparatus as shown in FIG. 2, and is shown as dots in FIG. 3A. In FIG. 3A, a fitted curve slightly over-predicts an SOC of "0.4" and slightly under-predicts an SOC of "0.37."

Similarly, fitting and experimental results illustrating a capacity fade rate of a rechargeable battery as a function of a current I using the capacity fade model are shown in FIG. 3B. As shown in FIG. 3B, the fitting and experimental results are in line with each other and prediction results remain the same.

FIGS. 4A through 4E illustrate examples of a validation result of a capacity fade rate of a rechargeable battery acquired in different voltage ranges.

For example, a number of cathode particles in a cathode is assumed as N, and the cathode particles are assumed to have a spherical shape with a radius $r_p$. A maximum volumetric capacity of a cathode material is represented by $c_p^{max}$. When a capacity decreases, the maximum volumetric capacity remains unchanged.

Based on a definition of a total capacity C, a relationship between a particle radius and the total capacity by a conservation of a lithium storage capacity is derived by Equation 18 shown below.

$$C = N \cdot \frac{4}{3} \pi r_p^3 c_p^{max} \quad \text{[Equation 18]}$$

For a constant current condition, when a finite approximation is used, Equation 19 is obtained.

$$\frac{\Delta C}{C} = -f_1(soc) \cdot \Delta(soc) \quad \text{[Equation 19]}$$

The capacity and particle radius are associated with Equation 20.

$$\frac{\Delta C}{C} = \left(\frac{r_p|_{t+\Delta t}}{r_p|_t}\right)^3 - 1 \quad \text{[Equation 20]}$$

A cathode particle size is updated in a pseudo two-dimensional (P2D) electrochemical model framework, as shown in Equation 21 below.

$$r_p|_{t+\Delta t} = r_p|_t (1 - f_1(\text{soc})\Delta(\text{soc}))^{1/3} \quad \text{[Equation 21]}$$

The above-described model is validated against experimental data. The above method is applied to Equation 22 shown below.

$$\log(f_1(\text{soc})) = \frac{0.0105}{\text{soc} - 0.346} - 2.8 \quad \text{[Equation 22]}$$

A current dependence function of Equation 22 is regarded as a unity, for example, "1", because there is no change in a current. It is not possible to formulate the current dependence function. Thus, cycling is performed using a smooth $f_1(\text{soc})$ function. It is known that a capacity loss in a Li-NCM battery occurs due to a cathode particle dissolution. A capacity loss predicted by a current model is implemented in a physics-based model.

Figure 4A:
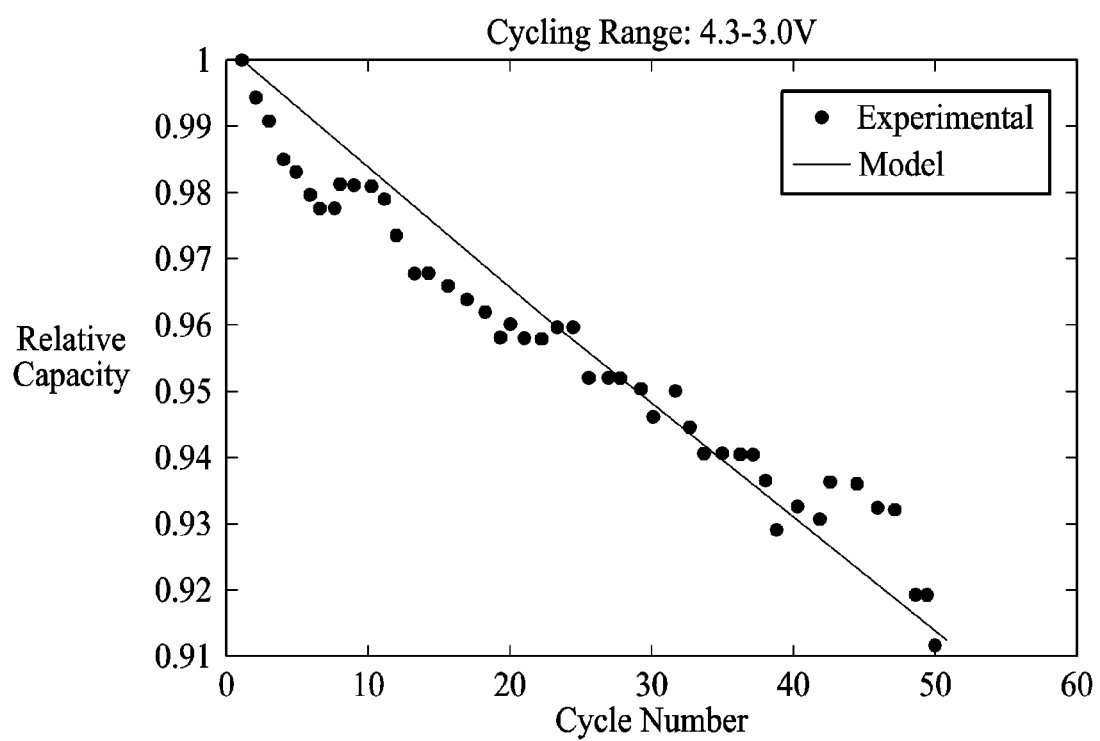
Figure 4C:
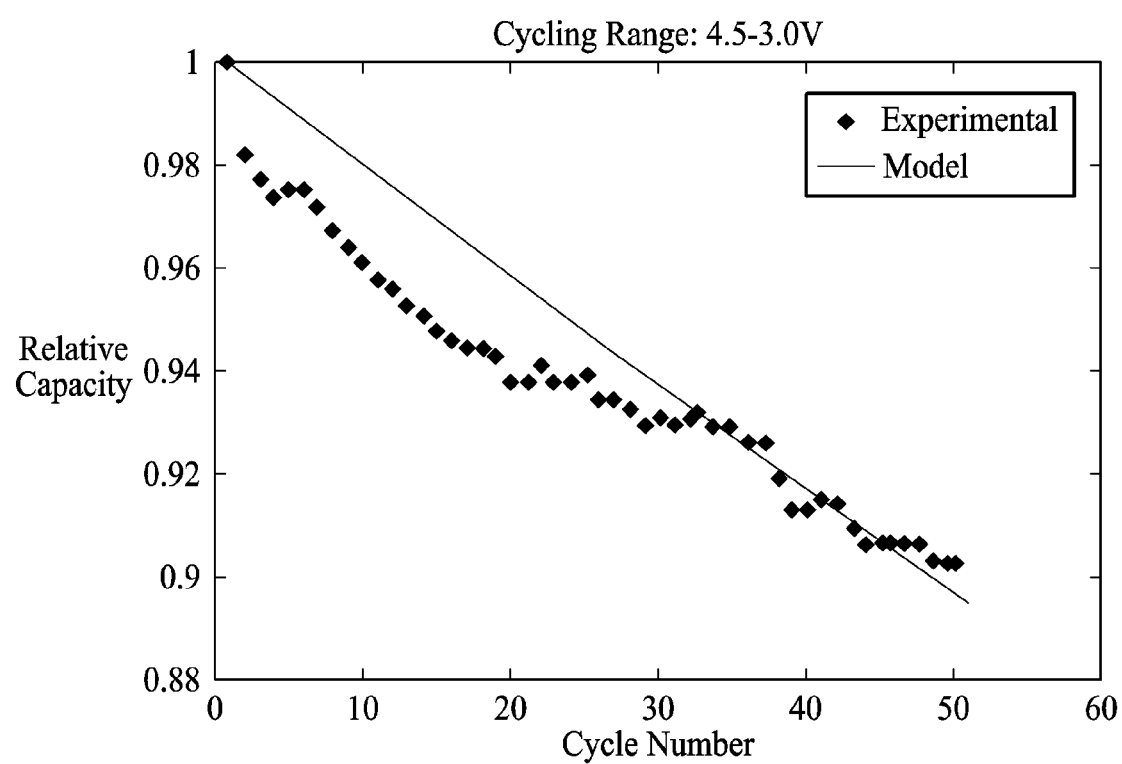
Figure 4D:
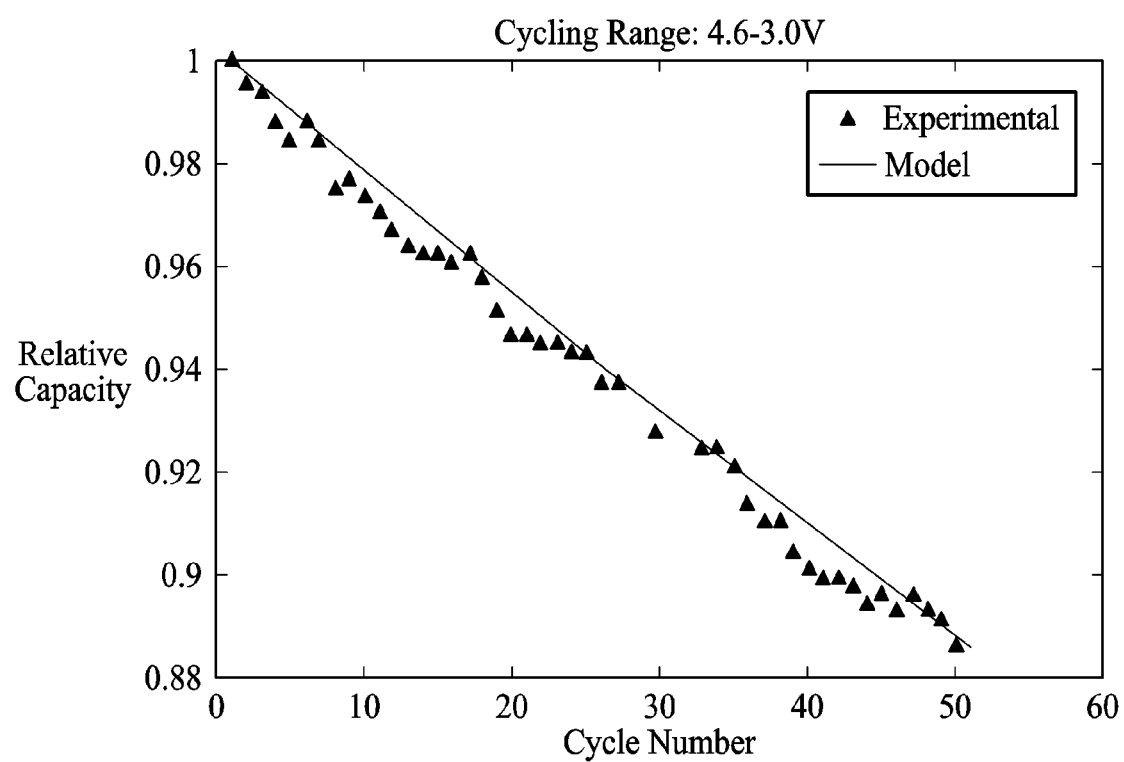
Figure 4E:
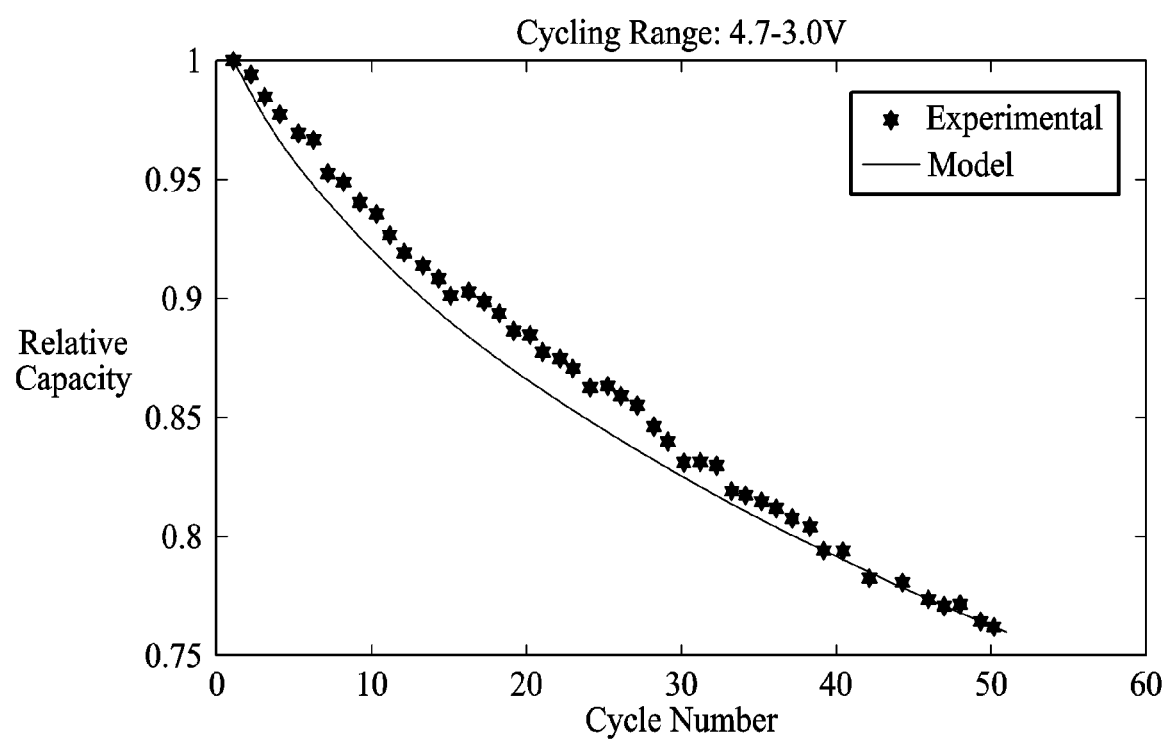

A capacity of a cell is predicted under different operating conditions for multiple cycles, and is shown in FIGS. 4A through 4E. Validation results have a high prediction accuracy and exceed 90% for all cases. Also, as shown in FIG. 4E, a smooth function captures a high capacity fade trend in a range of 4.7 V to 3.0 V under a discharge condition.

A generalized capacity fade model for an arbitrary Li-ion battery is set or provided through the above method. Due to a less time and effect for data collection, a model is easily implemented with a battery management system (BMS) in a form similar to a capacity fade model. Examples are used in conjunction with other established models, for example, a model of a degradation due to a growth of an SEI at a graphite anode. Also, examples are used to predict a life expectancy for an arbitrary usage pattern that includes a pattern learned from a use or testing or a pattern provided from a user.

Capacity fade data collected onboard is analyzed in a cloud for an optimized performance, for example, a life extension or a performance enhancement. According to examples, the method and apparatus of FIGS. 1 and 2, respectively, provide a long term benefit analysis through an application based on a smart power management tool. Also, according to examples, the method and apparatus of FIGS. 1 and 2, respectively, easily detect a capacity fade rate by comparing a predetermined usage profile input and a corresponding output.

The system 200, the apparatuses 201 and 208, the multichannel battery cycler 202, the capacity degradation modeler 204, the onboard controller 203, the battery controller chip 206, and other apparatuses, units, modules, devices, and other components described herein with respect to FIG. 2 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 1 that performs the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of predicting a capacity fade rate of a battery, the method comprising:
    collecting capacity degradation data of a battery based on a current and a state of charge (SOC) for a number of cycles;
    generating a capacity fade model based on the capacity degradation data; and
    estimating a capacity fade rate of the battery using the capacity fade model, wherein
    the capacity fade model comprises dividing a difference in logarithm of fractional capacities after a cycling between different SOCs by a product that comprises a difference between the SOCs and the number of cycles, and
    the fractional capacities are each defined as a ratio of a cell capacity at an end of the cycling to an initial cell capacity.

2. The method of claim 1, wherein the battery comprises any one or any combination of a nickel-cadmium battery, a nickel-metal hydride battery, a lithium-ion battery, a lithium sulfur battery, a thin film battery, a carbon foam-based lead acid battery, a potassium-ion battery and a sodium-ion battery.

3. The method of claim 1, wherein the number of cycles is determined based on maximum allowable degradation conditions.

4. The method of claim 2, wherein
    the capacity degradation data is collected based on a change in the at least one degradation condition, and
    the at least one degradation condition comprises a first condition with an equal degradation level during a charge and discharge cycle and a second condition with a different degradation level during a charge and discharge cycle, at a constant charging current.

5. The method of claim 1, wherein the capacity fade rate is notified from a mobile phone of a user.

6. A non-transitory computer-readable storage medium storing instructions that, when executed by a processor, cause the processor to perform the method of claim 1.

7. An apparatus for predicting a capacity fade rate of a battery, the apparatus comprising:
    a multichannel battery cycler configured to collect capacity degradation data of a battery based on a current and a state of charge (SOC) for a number of cycles;
    a capacity fade modeler configured to generate a capacity fade model based on the capacity degradation data; and
    a controller configured to estimate a capacity fade rate of the battery using the capacity fade model,
    wherein the capacity fade model comprises dividing a difference in logarithm of fractional capacities after a cycling between different SOCs by a product that comprises a difference between the SOCs and the number of cycles, and
    wherein the fractional capacities are each defined as a ratio of a cell capacity at an end of the cycling to an initial cell capacity.

8. The apparatus of claim 7, wherein the battery comprises any one or any combination of a nickel-cadmium battery, a nickel-metal hydride battery, a lithium-ion battery, a lithium sulfur battery, a thin film battery, a carbon foam-based lead acid battery, a potassium-ion battery and a sodium-ion battery.

9. The apparatus of claim 7, wherein the number of cycles is determined based on maximum allowable degradation conditions.

10. The apparatus of claim 7, wherein
    the capacity degradation data is collected based on a change in the at least one degradation condition, and
    the at least one degradation condition comprises a first condition with an equal degradation level during a charge and discharge cycle and a second condition with a different degradation level during a charge and discharge cycle, at a constant charging current.

11. The apparatus of claim 7, wherein the capacity fade rate is notified from a mobile phone of a user.

* * * * *